United States Patent
Seong et al.

(10) Patent No.: US 9,509,258 B2
(45) Date of Patent: Nov. 29, 2016

(54) SIGNAL AMPLIFIER HAVING INVERTED TOPOLOGY IN STACKED COMMON GATE STRUCTURE

(71) Applicant: Samsung Electro-Mechanics Co., Ltd., Suwon-Si (KR)

(72) Inventors: Nack Gyun Seong, Suwon-Si (KR); Seung Goo Jang, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/701,629

(22) Filed: May 1, 2015

(65) Prior Publication Data

US 2016/0079935 A1    Mar. 17, 2016

(30) Foreign Application Priority Data

Sep. 15, 2014 (KR) .................. 10-2014-0122329

(51) Int. Cl.
| | |
|---|---|
| *H03F 1/56* | (2006.01) |
| *H03F 3/21* | (2006.01) |
| *H03F 3/19* | (2006.01) |
| *H03F 3/193* | (2006.01) |

(52) U.S. Cl.
CPC .............. *H03F 1/565* (2013.01); *H03F 3/193* (2013.01); *H03F 3/211* (2013.01); *H03F 2200/72* (2013.01); *H03F 2203/21106* (2013.01); *H03F 2203/21139* (2013.01)

(58) Field of Classification Search
USPC ......... 330/277, 311, 295, 124 R, 286, 84, 53
See application file for complete search history.

(56) References Cited

U.S. PATENT DOCUMENTS

| | | | |
|---|---|---|---|
| 6,392,485 B1 | 5/2002 | Doi et al. | |
| 8,577,325 B2 * | 11/2013 | Lee ...................... | H03F 1/0261 330/277 |
| 2011/0156817 A1 | 6/2011 | Hwang et al. | |
| 2012/0154305 A1 | 6/2012 | Nunomaki | |

FOREIGN PATENT DOCUMENTS

| | | |
|---|---|---|
| JP | 2005-192260 A | 7/2005 |
| JP | 2005-303347 A | 10/2005 |
| JP | 2008-527802 A | 7/2008 |
| KR | 10-2011-0076335 A | 7/2011 |
| KR | 10-2012-0070500 A | 6/2012 |
| WO | WO 2006/073701 A2 | 7/2006 |

* cited by examiner

*Primary Examiner* — Hieu Nguyen
(74) *Attorney, Agent, or Firm* — NSIP Law

(57) ABSTRACT

A signal amplifier may include a first common gate-type amplifying unit connected to a source voltage terminal, dividing an input signal into two signals, amplifying the two divided signals, respectively, and providing a first signal and a second signal, a second common gate-type amplifying unit connected to a ground, dividing the input signal into two signals, amplifying the two divided signals, respectively, and providing a third signal and a fourth signal, a signal summing unit summing the first signal and the second signal from the first common gate-type amplifying unit and the third signal and the fourth signal from the second common gate-type amplifying unit, and an impedance matching unit impedance-matching a signal summed by the signal summing unit.

19 Claims, 12 Drawing Sheets

<RESONANCE FREQUENCY>  $f_o = \dfrac{1}{2\pi\sqrt{L_o \cdot C_o}}$

SIGNAL AMPLIFIER HAVING INVERTED TOPOLOGY IN STACKED COMMON GATE STRUCTURE

CROSS-REFERENCE TO RELATED APPLICATION

This application claims priority to, and the benefit of, Korean Patent Application No. 10-2014-0122329 filed on Sep. 15, 2014, in the Korean Intellectual Property Office, the disclosure of which is incorporated herein by reference for purposes.

BACKGROUND

The present disclosure relates to a signal amplifier having inverted topology in a stacked common gate structure, which may be used for a radio frequency (RF) receiving terminal of an ultrawideband (UWB) communications system.

In general, as a demand for wireless communications and various other communications standards increases, demand for multiband transmitters and receivers capable of simultaneously processing signals within various bands in a single portable device has increased.

For example, the wireless local area network (WLAN) standard simultaneously uses the 2.4 GHz and 5 GHz bands, while domestic long term evolution (LIE) simultaneously uses the 300 MHz, 900 MHz, 1300 MHz, and 2.1 GHz bands.

Therefore, a device for transmitting and receiving multiband signals in a signal RF front-end module is required, and particularly, technology for processing various frequencies or a wideband frequencies using a single low noise amplifier (LNA) disposed at an initial stage of the receiver is required.

Meanwhile, the low noise amplifier supporting a concurrent dualband capable of simultaneously processing signals within two different bands or supporting wideband frequencies may have a cascode structure or a cascade structure.

Typically, since an amplifier having the cascode structure, a structure having two transistors stacked between a power terminal and a ground GND, has a single current path, it has an advantage in that current consumption is low. However, since it includes a common gate amplifier in which gain characteristics are poor and a common source amplifier in which gain characteristics are excellent, there is a need to improve gain characteristics when a common gate amplifier is used.

In addition, an amplifier having a cascade structure has a structure including amplifying units for at least four stages between an input terminal and an output terminal. Since the amplifying unit of each stage may be formed of the common source amplifier, the gain characteristics thereof are excellent. However, since the amplifying units of each stage consume a large amount of current due to two or more current paths, there is a need for improvement in terms of current consumption.

As described above, when a common gate amplifier having low current consumption is used, improvements of relatively bad gain characteristics are required.

SUMMARY

An exemplary embodiment in the present disclosure may provide a signal amplifier having inverted topology in a stacked common gate structure capable of reducing current consumption, improving gain characteristics, and reducing the use of an inductor for an input and output matching.

According to an exemplary embodiment in the present disclosure, a signal amplifier may include: a first common gate-type amplifying unit connected to a source voltage terminal, dividing an input signal into two signals, amplifying the two divided signals, respectively, and providing a first signal and a second signal; a second common gate-type amplifying unit connected to a ground, dividing the input signal into two signals, amplifying the two divided signals, respectively, and providing a third signal and a fourth signal; a signal summing unit summing the first signal and the second signal from the first common gate-type amplifying unit and the third signal and the fourth signal from the second common gate-type amplifying unit; and an impedance matching unit impedance-matching a signal summed by the signal summing unit.

Since the first common gate-type amplifying unit and the second common gate-type amplifying unit form a single current path between the source voltage terminal and the ground terminal, current consumption may be reduced.

Levels of transconductance of the first common gate-type amplifying unit and the second common gate-type amplifying unit may be set so that matching of input impedance is undertaken.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
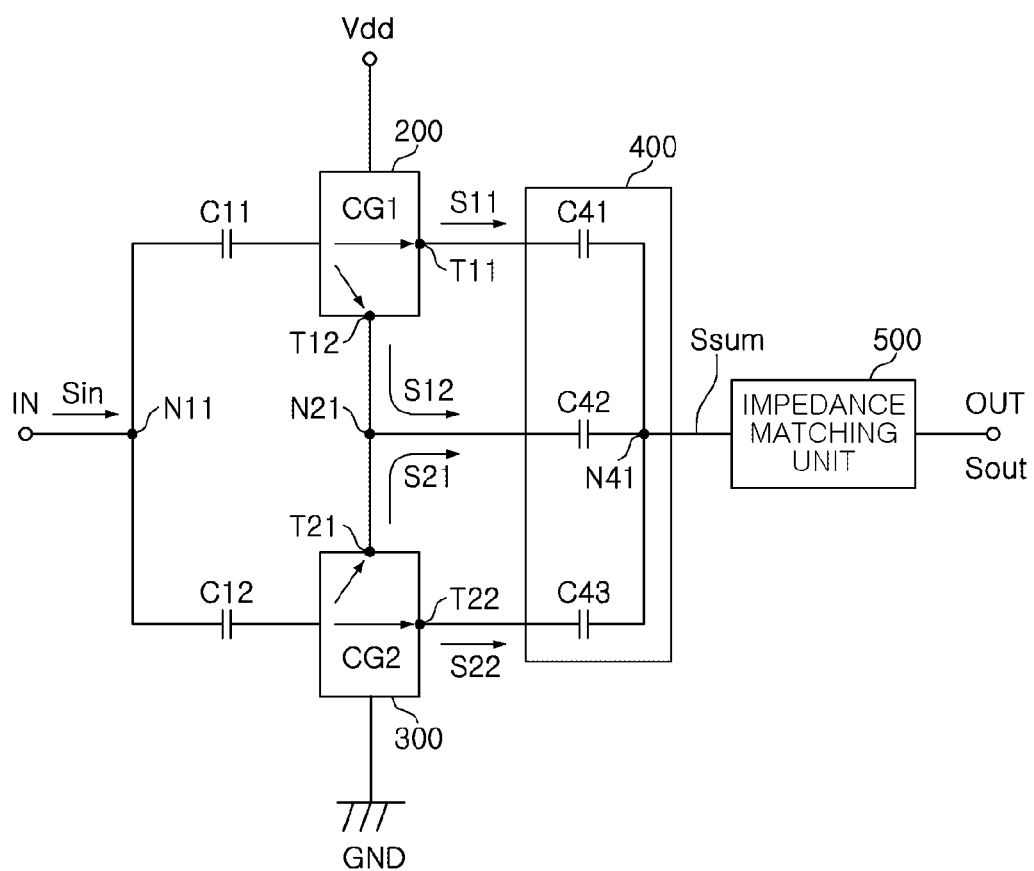
FIG. 1 is a circuit diagram of a signal amplifier according to an exemplary embodiment in the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a circuit diagram of a signal amplifier according to an exemplary embodiment in the present disclosure.

Referring to FIG. 1, a signal amplifier according to an exemplary embodiment in the present disclosure may include a first common gate-type amplifying unit 200, a second common gate-type amplifying unit 300, a signal summing unit 400, and an impedance matching unit 500.

The first common gate-type amplifying unit 200 may be connected to a source voltage Vdd terminal, distribute an input signal Sin input through an input terminal IN and a branch node N11 into two signals, amplify the two divided signals, respectively, and provide a first signal S11 and a second signal S12.

The second common gate-type amplifying unit 300 may be connected between the first common gate-type amplifying unit 200 and a ground GND, distribute the input signal Sin through the branch node N11 into two signals, amplify the two divided signals, respectively, and provide a third signal S21 and a fourth signal S22.

The first common gate-type amplifying unit 200 and the second common gate-type amplifying unit 300 may form a single current path between the source voltage terminal and the ground GND terminal.

In addition, levels of transconductance of the first common gate-type amplifying unit 200 and the second common gate-type amplifying unit 300 may be set so that matching of input impedance is undertaken. A detailed description thereof will be provided below.

In FIG. 1, T11 and T12 are a first output terminal and a second output terminal of the first common gate-type amplifying unit 200 and T21 and T22 are a third output terminal and a fourth output terminal of the second common gate-type amplifying unit 300.

The signal summing unit 400 may sum the first signal S11 and the second signal S12 from the first common gate-type amplifying unit 200 and the third signal S21 and the fourth signal S22 from the second common gate-type amplifying unit 300 at an output node N41, to be provided to the impedance matching unit 500. A detailed description thereof will be provided below.

The impedance matching unit 500 may form an impedance matching for a signal Ssum summed by the signal summing unit 400 and may provide an output signal Sout through an output terminal OUT.

Figure 2:
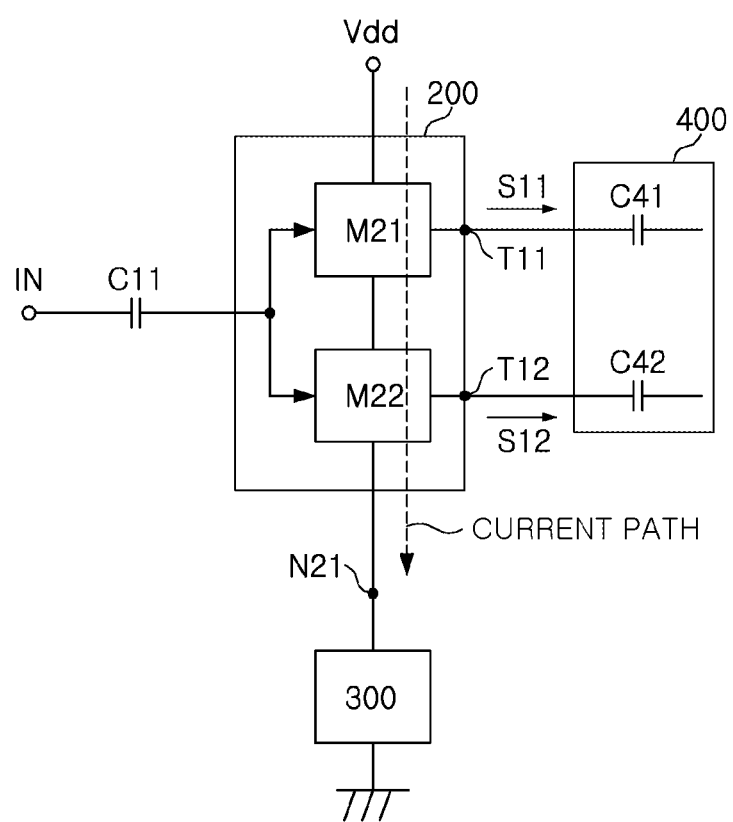
FIG. 2 is a configuration view of a first common gate-type amplifying unit according to an exemplary embodiment in the present disclosure.

FIG. 2 is a configuration view of a first common gate-type amplifying unit according to an exemplary embodiment in the present disclosure.

Referring to FIG. 2, the first common gate-type amplifying unit 200 may include a pair of first NMOS transistor M21 and first PMOS transistor M22.

The first NMOS transistor M21 may amplify the input signal and provide the first signal S11 to the signal summing unit 400. The first PMOS transistor M22 may amplify the input signal and provide the second signal S12 to the signal summing unit 400. As such, since each of the first NMOS transistor M21 and the first PMOS transistor M22 each may amplify the input signal, a gain may be improved.

In this case, the first NMOS transistor M21 and the first PMOS transistor M22 may be connected to each other in series between the source voltage Vdd terminal and the second common gate-type amplifying unit 300, to form a single current path. By the single current path described above, consumption of a driving current may be reduced.

Figure 3:
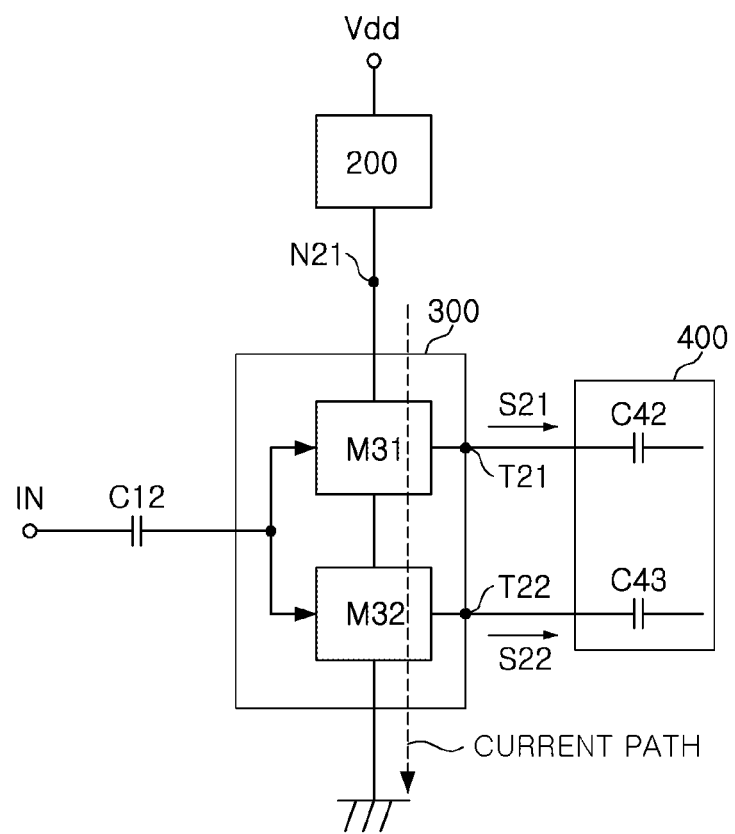
FIG. 3 is a configuration view of a second common gate-type amplifying unit according to an exemplary embodiment in the present disclosure.

FIG. 3 is a configuration view of a second common gate-type amplifying unit according to an exemplary embodiment in the present disclosure.

Referring to FIG. 3, the second common gate-type amplifying unit 300 may include a pair of second NMOS transistor M31 and second PMOS transistor M32.

The second NMOS transistor M31 may amplify the input signal and provide the third signal S21 to the signal summing unit 400. The second PMOS transistor M32 may amplify the input signal and provide the fourth signal S22 to the signal summing unit 400. As such, since each of the second NMOS transistor M31 and the second PMOS transistor M32 each may amplify the input signal, a gain may be improved.

In this case, the second NMOS transistor M31 and the second PMOS transistor M32 may be connected to each other in series between the second common gate-type amplifying unit 300 and the ground, to form a single current path. By the single current path described above, consumption of a driving current may be reduced.

Figure 4:
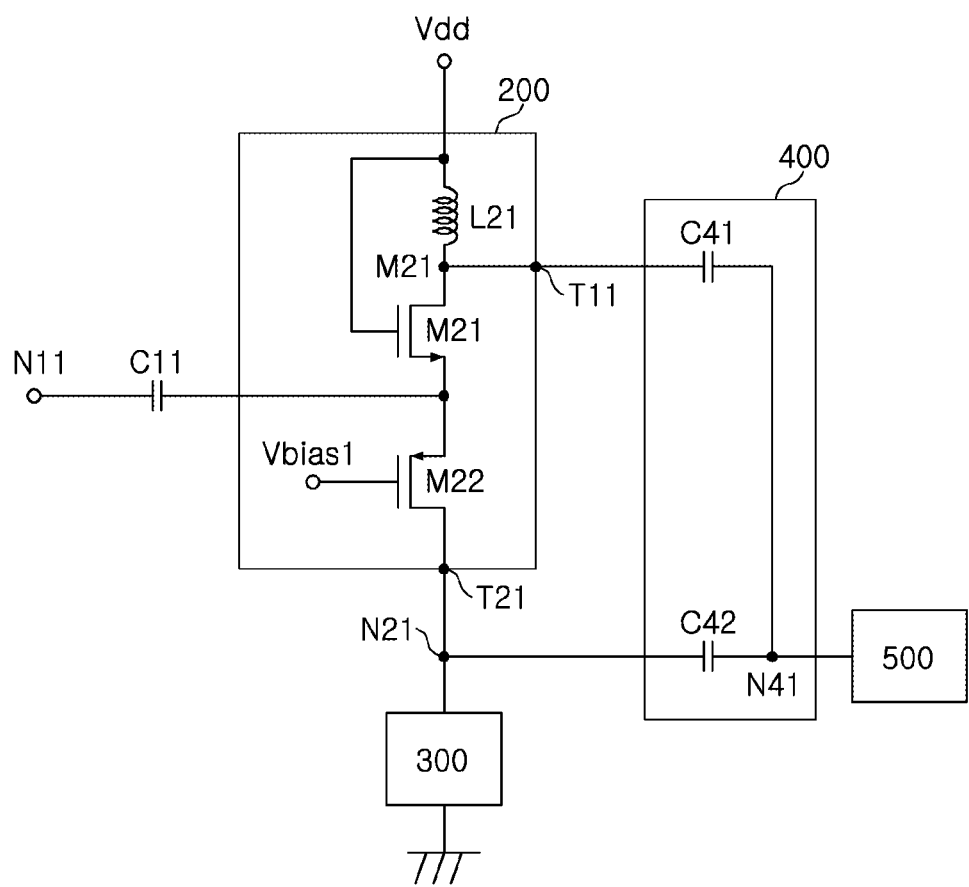
FIG. 4 is a view of a first example of the first common gate-type amplifying unit according to an exemplary embodiment in the present disclosure.

FIG. 4 is a view of a first example of the first common gate-type amplifying unit according to an exemplary embodiment in the present disclosure.

Referring to FIG. 4, the first common gate-type amplifying unit 200 may include the first NMOS transistor M21 having a drain and a gate connected to the source voltage Vdd terminal and a source receiving an input signal, amplifying the input signal through the source, and providing the first signal S11 to the signal summing unit 400 through the drain, and the first PMOS transistor M22 having a source receiving the input signal, a gate connected to a first bias voltage terminal, and a drain connected to a common node N21 connected to the signal summing unit 400, amplifying the input signal through the source, and providing the second signal S12 to the signal summing unit 400 through the drain.

Figure 5:
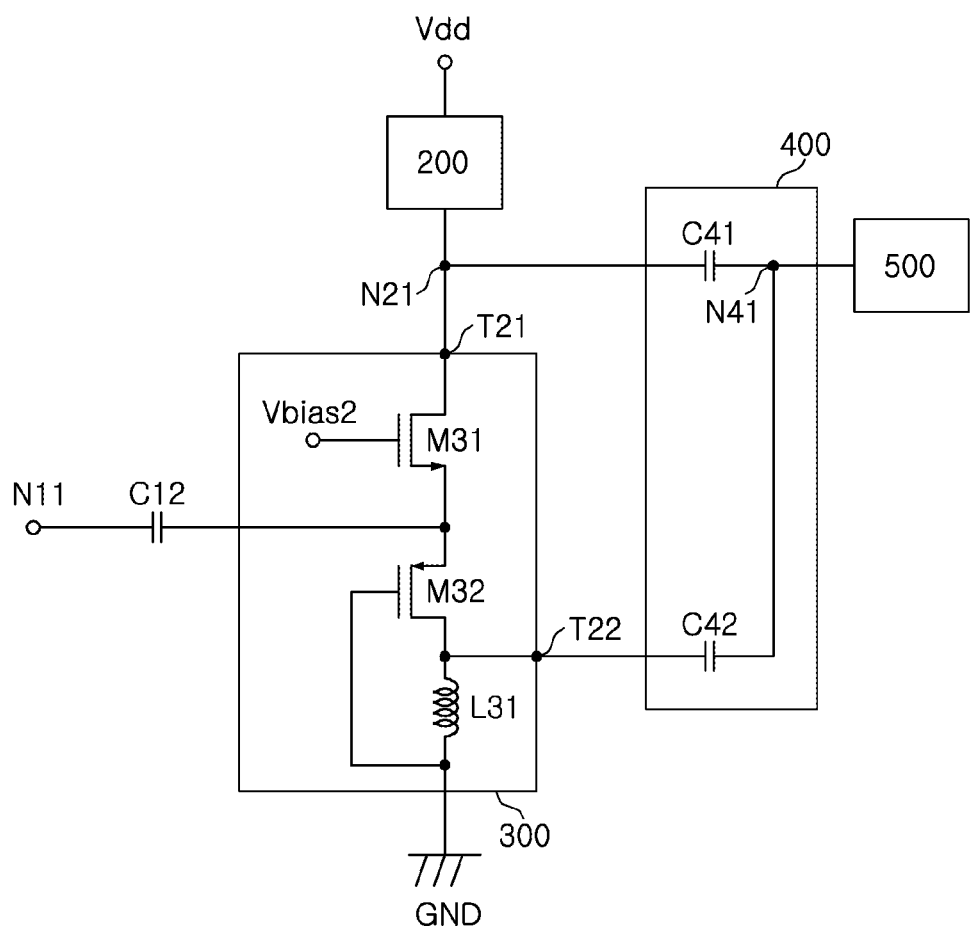
FIG. 5 is a view of a first example of the second common gate-type amplifying unit according to an exemplary embodiment in the present disclosure.

FIG. 5 is a view of a first example of the second common gate-type amplifying unit according to an exemplary embodiment in the present disclosure.

Referring to FIG. 5, the second common gate-type amplifying unit 300 may include the second NMOS transistor M31 having a drain connected to a common node N21 connected to the signal summing unit 400, a gate connected to a second bias voltage Vbias2 terminal, and a source receiving the input signal, amplifying the input signal through the source, and providing the amplified input signal to the signal summing unit 400 through the drain, and the second PMOS transistor M32 having a source receiving the input signal, and a drain and a gate connected to a ground GND, amplifying the input signal through the source, and providing the amplified input signal to the signal summing unit 400 through the drain.

In addition, the first common gate-type amplifying unit 200 according to an exemplary embodiment in the present disclosure may further include a first inductor L21 between the source voltage Vdd terminal and the first NMOS transistor M21 and the second common gate-type amplifying unit 300 may also include a second inductor L31 between the ground and the second PMOS transistor M32.

Referring to FIGS. 4 and 5, the first NMOS transistor M21 may be driven by the operation voltage Vdd, the first PMOS transistor M22 and the second NMOS transistor M31 may be driven by the first and second bias voltages Vbias1 and Vbias2, and consequently, the second PMOS transistor M32 may be driven.

In this case, the input signal is amplified by the first NMOS transistor M21, such that the first signal S11 may be provided to the signal summing unit 400, and the input signal is amplified by the first PMOS transistor M22, such that the second signal S12 may be provided to the signal summing unit 400. In addition, the input signal is amplified by the second PMOS transistor M31, such that the third signal S21 may be provided to the signal summing unit 400, and the input signal is amplified by the second NMOS transistor M23, such that the fourth signal S22 may be provided to the signal summing unit 400.

Therefore, since the input signal is individually amplified by each of the four transistors M21, M22, M31, and M32, a gain may be improved. In addition, levels of transconductance of the first NMOS transistor M21, the first PMOS transistor M22, the second NMOS transistor M31, and the second PMOS transistor M32 may be set so that matching of input impedance is undertaken.

In addition, in the signal amplifier according to an exemplary embodiment in the present disclosure, input impedance Zin may be determined by the following Equation 1.

$$Zin = \frac{1}{gm} \quad \text{[Equation 1]}$$

According to the above-mentioned Equation 1, input impedance may be achieved by only transconductance gm of each of the first NMOS transistor M21, the first PMOS transistor M22, the second NMOS transistor M31, and the second PMOS transistor M32, without a separate passive element. Therefore, since the matching of input impedance may be determined by only transconductance of the transistor, there is an advantage that an additional element for the matching of input impedance is not necessary.

In addition, in the signal amplifier according to an exemplary embodiment in the present disclosure, noise characteristics may be determined by the following Equation 2.

$$Fmin \cong 1 + \frac{\gamma}{\alpha} \quad \text{[Equation 2]}$$

Fmin is minimum noise characteristics, $\alpha$ is a parameter depending on a channel length of the transistors M21, M22, M31, and M32, and $\gamma$ is a parameter depending on a drain-source voltage Vds and the channel length of the transistors M21, M22, M31, and M32. According to Equation 2, it may be appreciated that noise characteristics may be determined by determining a proper operation voltage Vdd and sizes of the transistors.

Meanwhile, since the common gate-type amplifier generally has transconductance lower than that of a common source-type amplifier, it has a disadvantage that the gain is low.

In order to compensate for the low gain described above, in the signal amplifier according to an exemplary embodiment in the present disclosure, since a pair of common gate-type transistors are each stacked on the first common gate-type amplifying unit 200 and the second common gate-type amplifying unit 300, respectively, to allow the input signal to be individually amplified by a total of four common gate-type transistors, respectively and to be then summed again, the signal amplifier according to an exemplary embodiment in the present disclosure may have a high gain despite of the common gate-type amplifier.

Figure 6:
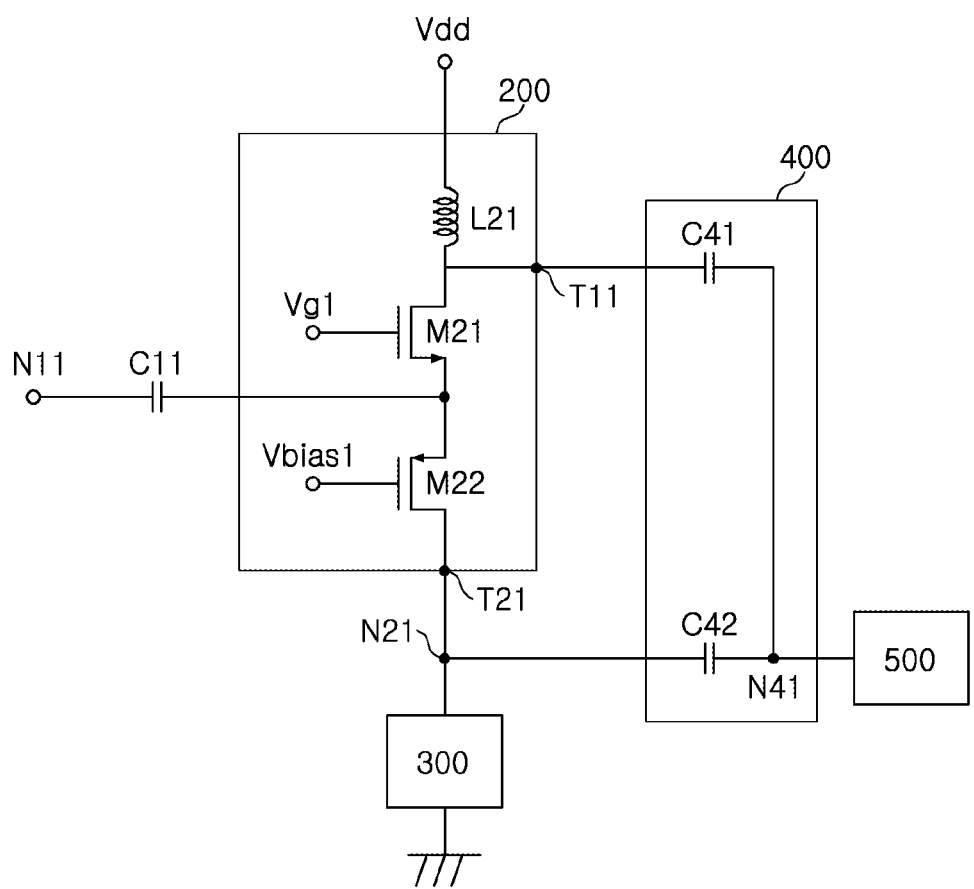
FIG. 6 is a view of a second example of the first common gate-type amplifying unit according to an exemplary embodiment in the present disclosure.

FIG. 6 is a view of a second example of the first common gate-type amplifying unit according to an exemplary embodiment in the present disclosure.

Referring to FIG. 6, the first common gate-type amplifying unit 200 may include the first NMOS transistor M21 having a drain connected to the source voltage Vdd terminal, a gate connected to a first gate voltage Vg1 terminal, and a source receiving an input signal, amplifying the input signal through the source, and providing the first signal S11 to the signal summing unit 400 through the drain, and the first PMOS transistor M22 having a source receiving the input signal, a gate connected to a first bias voltage terminal, and a drain connected to a common node N21 connected to the signal summing unit 400, amplifying the input signal through the source, and providing the second signal S12 to the signal summing unit 400 through the drain.

Figure 7:
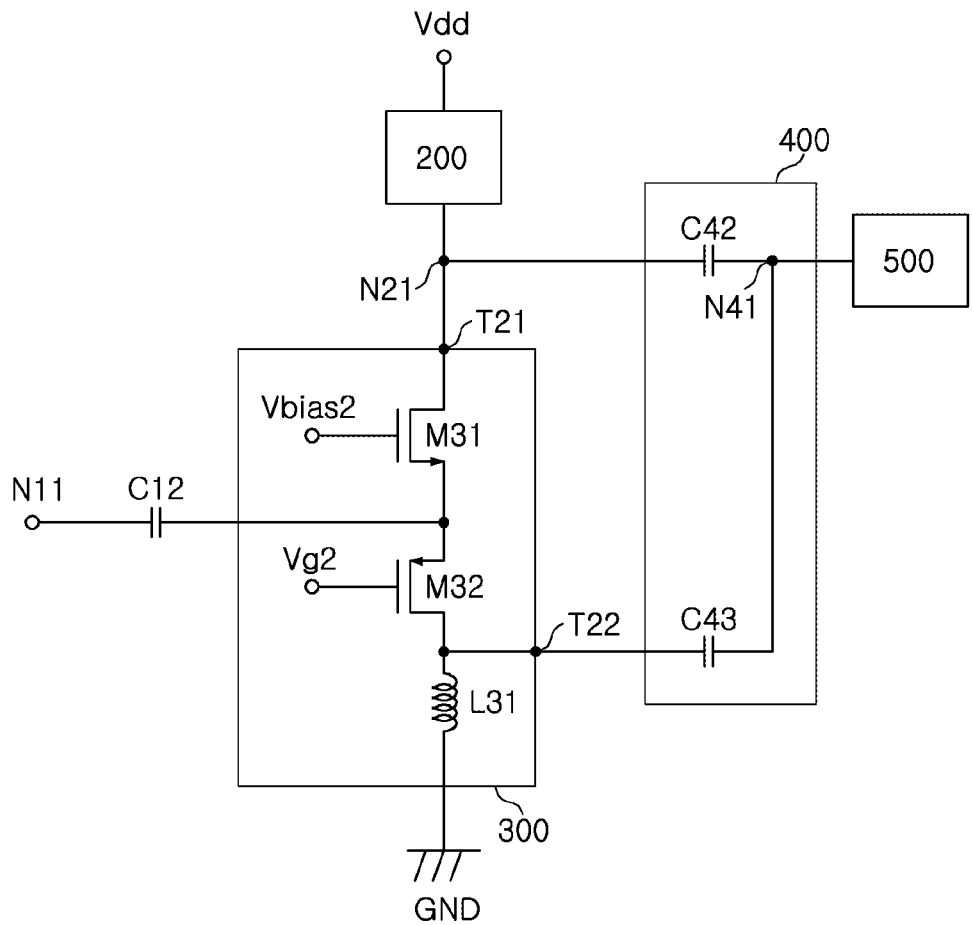
FIG. 7 is a view of a second example of the second common gate-type amplifying unit according to an exemplary embodiment in the present disclosure.

FIG. 7 is a view of a second example of the second common gate-type amplifying unit according to an exemplary embodiment in the present disclosure. Referring to FIG. 7, the second common gate-type amplifying unit 300 may include the second NMOS transistor M31 having a drain connected to a common node N21 connected to the signal summing unit 400, a gate connected to a second bias voltage Vbias2 terminal, and a source receiving the input signal, amplifying the input signal through the source, and providing the amplified input signal to the signal summing unit 400 through the drain, and the second PMOS transistor M32 having a source receiving the input signal, and a drain connected to a ground GND, and a gate connected to a second gate voltage Vg2 terminal, amplifying the input signal through the source, and providing the amplified input signal to the signal summing unit 400 through the drain.

Referring to FIGS. 6 and 7, while the operation voltage Vdd is supplied, the first NMOS transistor M21 and the second PMOS transistor N132 may be driven by the first and second gate voltages Vg1 and Vg2, and the first PMOS transistor M22 and the second NMOS transistor M31 may be driven by the first and second bias voltages Vbias1 and Vbias2.

In this case, the input signal is amplified by the first NMOS transistor M21, such that the first signal S11 may be provided to the signal summing unit 400, and the input signal is amplified by the first PMOS transistor M22, such that the second signal S12 may be provided to the signal summing unit 400. In addition, the input signal is amplified by the second PMOS transistor M32, such that the third signal S21 may be provided to the signal summing unit 400, and the input signal is amplified by the second NMOS transistor M31, such that the fourth signal S22 may be provided to the signal summing unit 400.

Even in cases of FIGS. 6 and 7, as described with reference to FIGS. 4 and 5, since the input signal is individually amplified by each of the four transistors M21, M22, M31, and M32, a gain may be improved.

Referring to FIGS. 1 through 7, the signal summing unit 400 may include a first capacitor C41 transferring the first signal from the first common gate-type amplifying unit 200 to the impedance matching unit 500, a second capacitor C42 transferring the second signal from the first common gate-type amplifying unit 200 and the third signal from the second common gate-type amplifying unit 300 to the impedance matching unit 500, and a third capacitor C43 transferring the fourth signal from the second common gate-type amplifying unit 300 to the impedance matching unit 500.

Here, one terminal of the first capacitor C41 is input with the first signal S11 from the first common gate-type amplifying unit 200, one terminal of the second capacitor C42 is input with the second signal S12 from the first common gate-type amplifying unit 200 and the third signal S21 from the second common gate-type amplifying unit 200, and one terminal of the third capacitor C43 is input with the fourth signal S22 from the second common gate-type amplifying unit 200.

In addition, the other terminal of each of the first capacitor C41, the second capacitor C42, and the third capacitor C43 may be connected to an output node N41, to be connected to the impedance matching unit 500.

In addition, referring to FIGS. 1 through 7, the first common gate-type amplifying unit 200 and the second common gate-type amplifying unit 300 may be formed in a cascode structure in which the first common gate-type amplifying unit 200 and the second common gate-type amplifying unit 300 are stacked between the source voltage Vdd terminal and the ground terminal. Therefore, the first common gate-type amplifying unit 200 and the second common gate-type amplifying unit 300 may form a single current path between the source voltage Vdd terminal and the ground terminal. As a result, since a path passing through the first common gate-type amplifying unit 200 and the second common gate-type amplifying unit 300 is one at the time of the operation of the first common gate-type amplifying unit 200 and the second common gate-type amplifying unit 300, current consumption may be relatively reduced as compared to a case in which there are two or more current paths.

Figure 8:
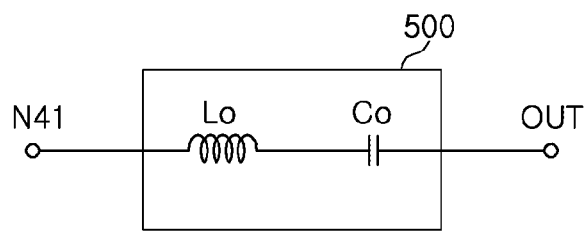
FIG. 8 is an explanation view of an impedance matching unit according to an exemplary embodiment in the present disclosure.

FIG. 8 is an explanation view of an impedance matching unit according to an exemplary embodiment in the present disclosure.

Referring to FIG. 8, the impedance matching unit 500 may include an output inductor Lo and an output capacitor Co that are connected to each other in series between the output node N41 and the output terminal OUT.

The output inductor Lo and the output capacitor Co are a series resonance circuit and a resonance frequency thereof may be expressed by the following Equation 3.

$$fo = \frac{1}{2\pi\sqrt{Lo*Co}} \quad \text{[Equation 3]}$$

The impedance matching unit 500 may match the resonance frequency fo to any frequency of a desired pass band such as a lower frequency, an upper frequency, or the like of the desired pass band. Thereby, since impedance may be matched to any frequency of a desired pass band such as the lower frequency, the upper frequency, or the like of the desired pass band, impedance matching characteristics may be improved.

Meanwhile, output impedance may be set to be satisfied by using the first inductor L21, the second inductor L31, and the output inductor Lo and the output capacitor Co of the impedance matching unit 500.

As an implementation example, in order to compensate for a disadvantage that the gain is deteriorated in a band of 8 GHz or more in the signal amplifier according to an exemplary embodiment in the present disclosure, gainflatness may be maintained by setting the output inductor Lo to about 1.0 nH and coupling the output inductor Lo to the output capacitor Co.

As described above, the impedance matching unit 500 according to an exemplary embodiment in the present disclosure may form an impedance matching for a concurrent dualband including a low band and a high band.

On the other hand, the signal amplifier according to an exemplary embodiment in the present disclosure may be operated as a concurrent dualband low noise amplifier. In this case, the input signal may include a first band signal and a second band signal, the first band signal may be a low band signal, and the second band signal may be a high band signal.

For example, when the signal amplifier according to an exemplary embodiment in the present disclosure is used for a WiFi communications module, the first band signal may be a signal of 2.4 GHz band and the second band signal may be a signal of 5 GHz band.

As another example, when the signal amplifier according to an exemplary embodiment in the present disclosure is used for a cellular phone using a long term evolution (LTE) band, the first band signal may be a signal of 850 MHz band and the second band signal may be a signal of 1,900 MHz band.

As another example, when the signal amplifier according to an exemplary embodiment in the present disclosure is used for an ultrawideband (UWB) communications system using a frequency range of 3 GHz to 13 GHz, the first band signal may be a signal of 3 GHz band and the second band signal may be a signal of 11 GHz band.

Figure 9:
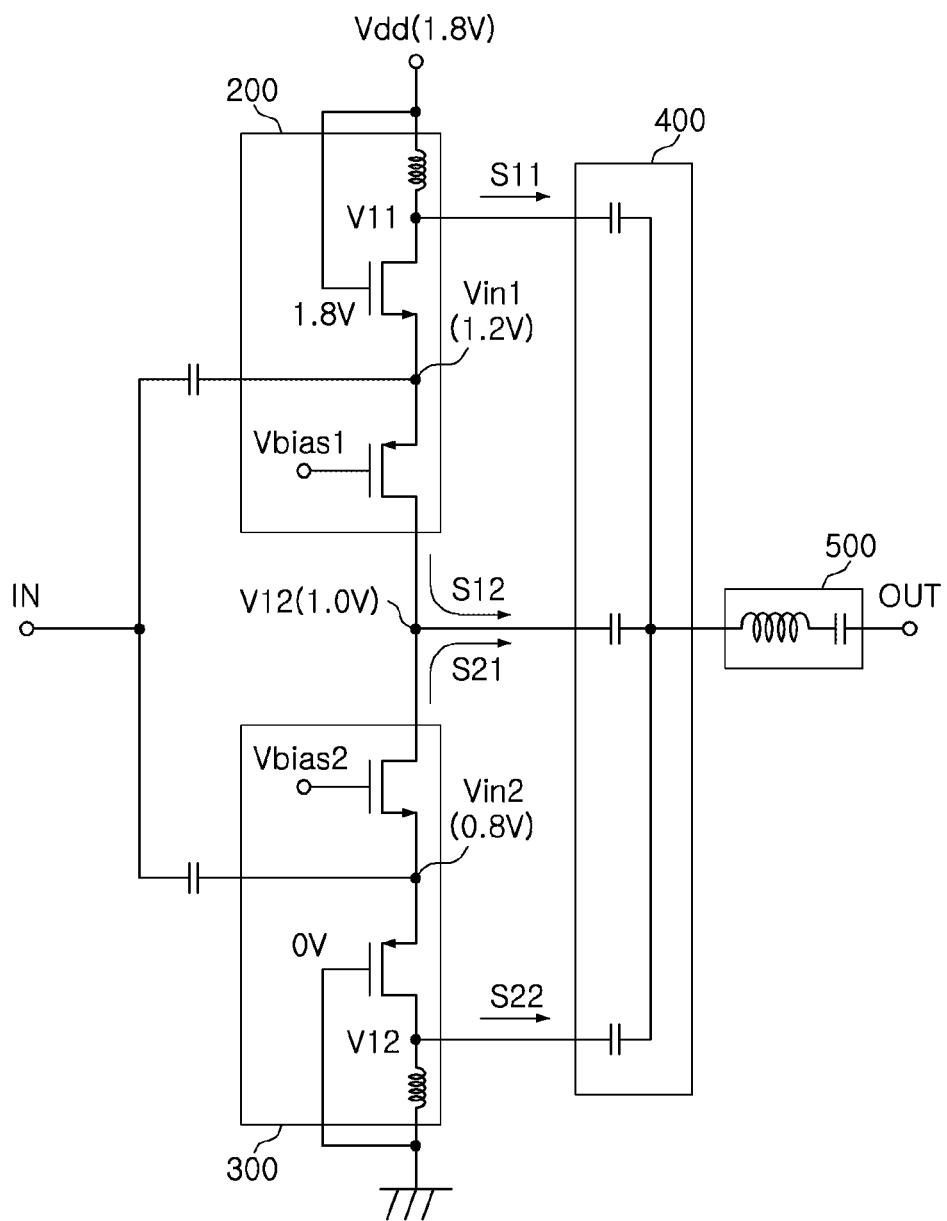
FIG. 9 is an explanation view of direct current voltages of the respective nodes of the signal amplifier according to an exemplary embodiment in the present disclosure.

FIG. 9 is an explanation view of direct current voltages of the respective nodes of the signal amplifier according to an exemplary embodiment in the present disclosure.

Referring to FIG. 9, the first NMOS transistor M21 may be driven by the operation voltage Vdd, the first PMOS transistor M22 and the second NMOS transistor M31 may be driven by the first and second bias voltages Vbias1 and Vbias2, and consequently, the second PMOS transistor M32 may be driven.

As an example, when the operation voltage Vdd is 1.8V, the first bias voltage Vbias1 is 0.6V, and the second bias voltage Vbias2 is 1.4V, a gate voltage of the first NMOS transistor M21 may be 1.8V, a first input voltage Vin1 of a connection node between the first NMOS transistor M21 and the first PMOS transistor M22 may be 1.2V, a voltage V12 of the common node N21, which is a connection node between the first PMOS transistor M22 and the second NMOS transistor M31 may be 1.0V, a second input voltage Vin2 of a connection node between the second NMOS transistor M31 and the second PMOS transistor M32 may be 0.8V, and a drain voltage of the second PMOS transistor M32 may be 0V.

In addition, in FIGS. 1 through 10, C1 and C2 may be blocking capacitors of DC input side.

Figure 10:
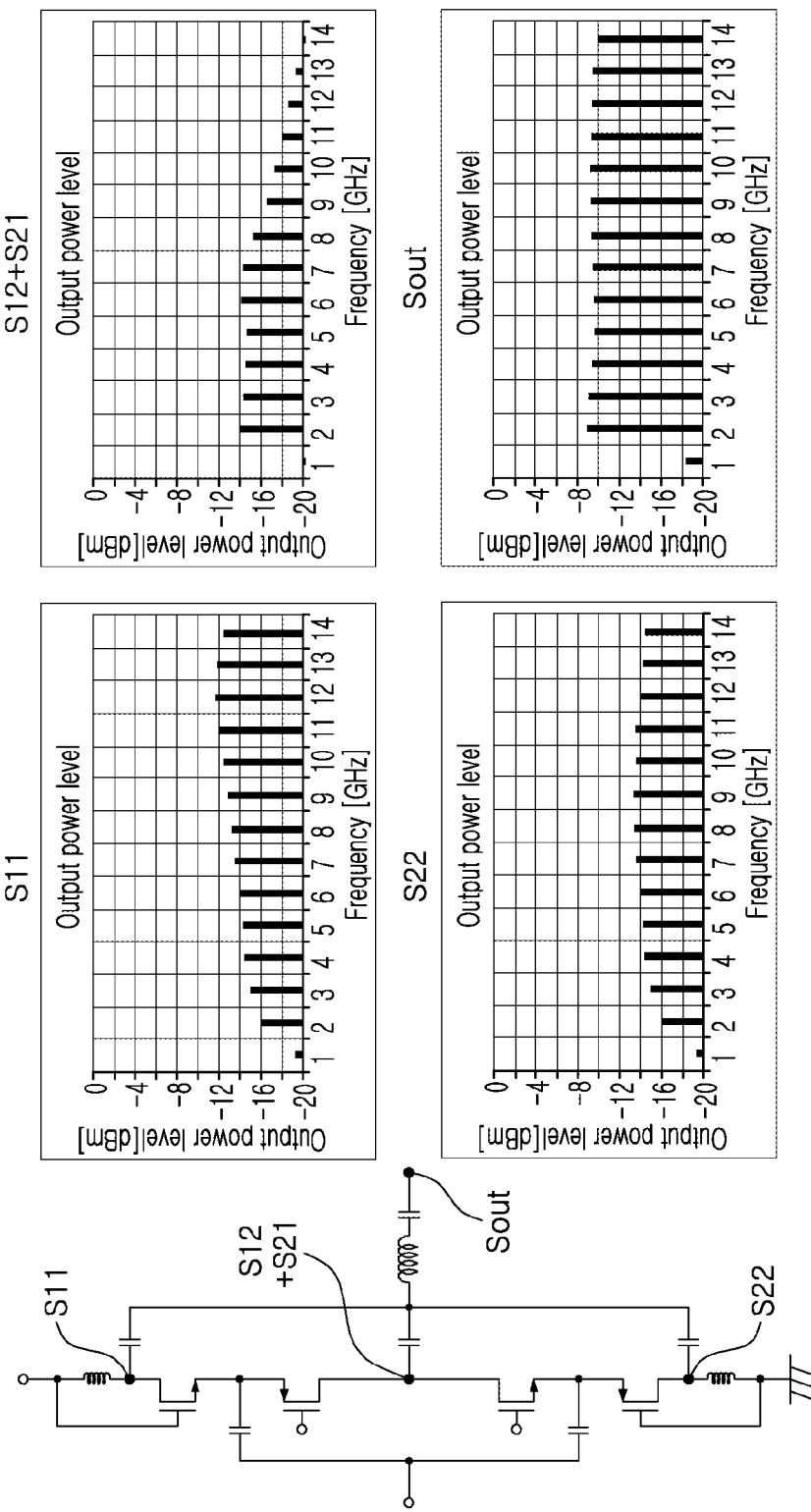
FIG. 10 is an explanation view of signal powers of the respective nodes of the signal amplifier according to an exemplary embodiment in the present disclosure.

FIG. 10 is an explanation view of signal powers of the respective nodes of the signal amplifier according to an exemplary embodiment in the present disclosure.

FIG. 10 shows power level examples for the first signal S11 output through the first output terminal T11 of the first common gate-type amplifying unit 200, a summed signal (S12+S21) of the second signal S12 output through the second output terminal T12 of the first common gate-type amplifying unit 200 and the third signal S21 output through the third output terminal T21 of the second common gate-type amplifying unit 300, and the fourth signal S22 output through the fourth output terminal T22 of the second common gate-type amplifying unit 300, respectively. In addition, FIG. 10 shows a power level example for the output signal Sout that the signals S11, S12+S21, and S22 are summed by the signal summing unit 400 to be output through the impedance matching unit 500.

It may be appreciated from the output signal Sout that the gain is approximately uniform in the range of frequencies of about 2 GHz to 14 GHz.

Figure 11:
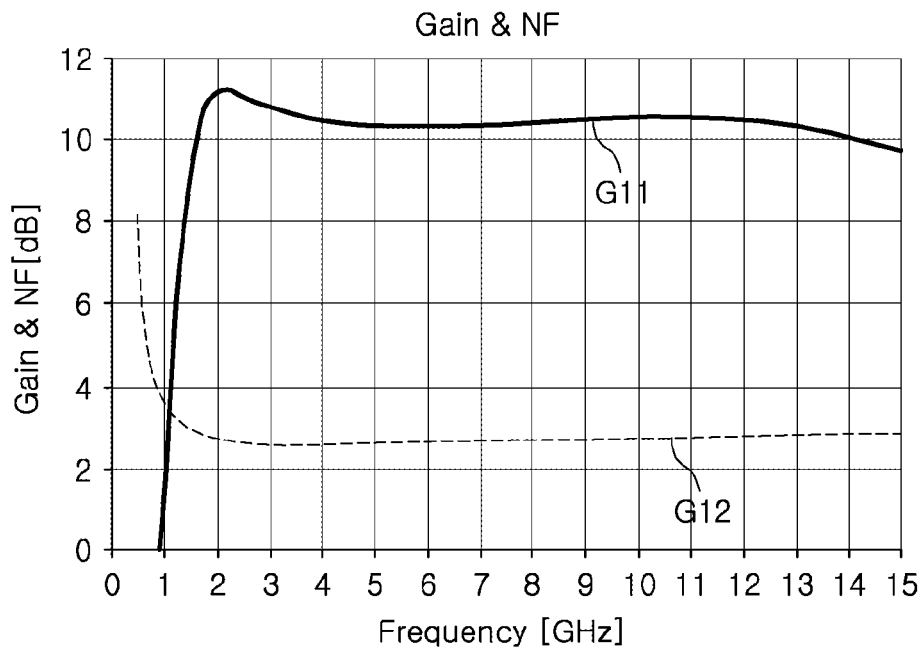
FIG. 11 is a characteristic graph of a gain and a noise factor according to an exemplary embodiment in the present disclosure.
Figure 12:
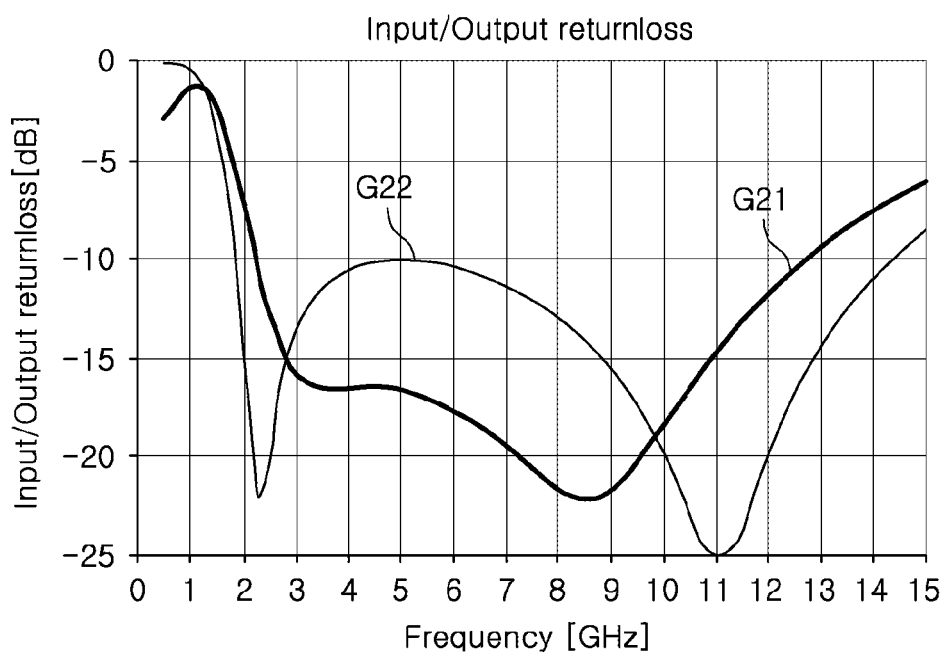
FIG. 12 is a characteristic graph of an input and output return loss according to an exemplary embodiment in the present disclosure.

FIG. 11 is a characteristic graph of a gain and a noise factor according to an exemplary embodiment in the present disclosure and FIG. 12 is a characteristic graph of an input and output return loss according to an exemplary embodiment in the present disclosure.

In FIG. 11, G11 is a gain characteristics graph and G12 is a noise factor (NF) characteristics graph.

In FIG. 12, G21 is an input return loss graph and G22 is an output return loss graph. In the characteristics graphs of FIGS. 11 and 12, an IBMCMOSSOI0.18 μm process is used, a frequency band is in the range of 3.1 GHz to 13 GHz, and Vdd is 1.8V.

Referring to FIGS. 11 and 12, it may be appreciated that a voltage gain of 10 dB or more and NF characteristics of Max.2.8 dB are satisfied in a full band, and characteristics that both input and output return coefficients satisfy 10 dB or more may be obtained. In addition, a consumed current is about 6.5 mA, which exhibits power consumption characteristics of about 11.5 mW.

Figure 13:
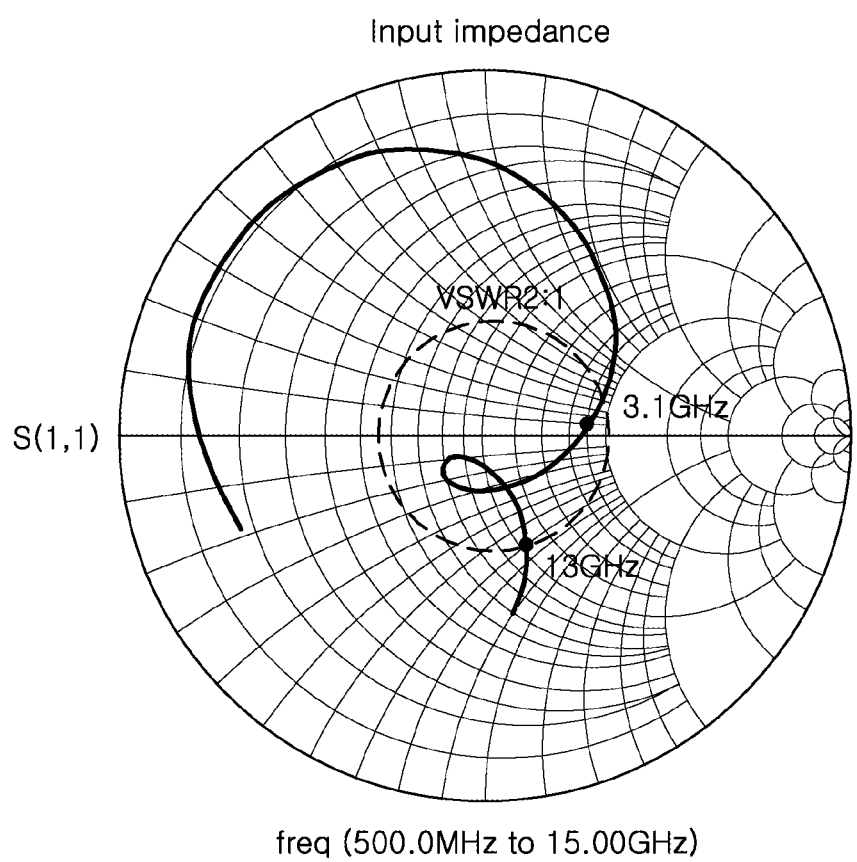
FIG. 13 is a chart for describing an input impedance matching according to an exemplary embodiment in the present disclosure.
Figure 14:
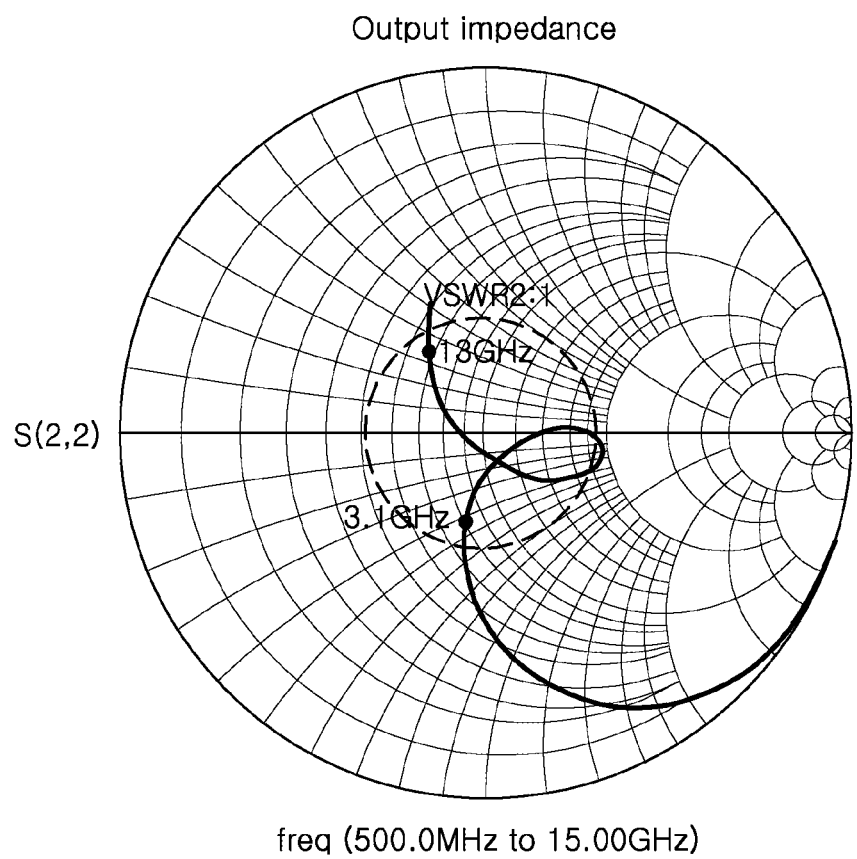
FIG. 14 is a chart for describing an output impedance matching according to an exemplary embodiment in the present disclosure.

FIG. 13 is a chart for describing an input impedance matching according to an exemplary embodiment in the present disclosure and FIG. 14 is a chart for describing an output impedance matching according to an exemplary embodiment in the present disclosure.

Referring to FIGS. 13 and 14, it may be appreciated from input impedance and output impedance that impedance conditions are satisfied at 3.1 GHz and 13 GHz, respectively, with reference to a VSWR 2:1 notation, which is a condition satisfying the input and output return loss of −10 dB.

As set forth above, according to exemplary embodiments of the present disclosure, the signal amplifier may be used for the low power UWB LNA design, and may reduce the current consumption, improve the gain, reduce the use of the inductor for the input and output matching, and reduce a chip area by being designed in the inverted topology using the common gate-type amplifier having a pair of NMOS transistor and PMOS transistor.

While exemplary embodiments have been shown and described above, it will be apparent to those skilled in the art that modifications and variations could be made without departing from the scope of the present invention as defined by the appended claims.

What is claimed is:

1. A signal amplifier comprising:
    a first common gate-type amplifying unit connected to a source voltage terminal, configured to divide an input signal into two signals, configured to amplify the two divided signals, respectively, and configured to provide a first signal and a second signal, wherein the first common gate-type amplifying unit includes:
        a first n-type metal oxide semiconductor (NMOS) transistor configured to amplify the input signal and configured to provide the first signal to the signal summing unit, and
        a first p-type metal oxide semiconductor (PMOS) transistor configured to amplify the input signal and configured to provide the second signal to the signal summing unit;
    a second common gate-type amplifying unit connected between the first common gate-type amplifying unit and a ground, configured to divide the input signal into two signals, configured to amplify the two divided signals, respectively, and configured to provide a third signal and a fourth signal, wherein the first NMOS transistor and the first PMOS transistor are connected to each other in series between the source voltage terminal and the second common gate-type amplifying unit, to form a single current path;
    a signal summing unit configured to sum the first signal and the second signal from the first common gate-type amplifying unit and the third signal and the fourth signal from the second common gate-type amplifying unit; and
    an impedance matching unit configured to impedance-match a signal summed by the signal summing unit,
    wherein the first common gate-type amplifying unit and the second common gate-type amplifying unit form a single current path between the source voltage terminal and a ground terminal.

2. The signal amplifier of claim 1, wherein the first common gate-type amplifying unit includes:
    a first NMOS transistor having a drain and a gate connected to the source voltage terminal and a source configured to receive the input signal, configured to amplify the input signal through the source, and configured to provide the first signal to the signal summing unit through the drain; and
    a first PMOS transistor having a source configured to receive an input signal, a gate connected to the first bias voltage terminal, and a drain connected to a common node connected to the signal summing unit, configured to amplify the input signal through the source, and configured to provide the second signal to the signal summing unit through the drain.

3. The signal amplifier of claim 1, wherein the first common gate-type amplifying unit includes:
    a first NMOS transistor having a drain connected to the source voltage terminal, a gate connected to a first gate voltage terminal, and a source configured to receive the input signal, configured to amplify the input signal through the source, and configured to provide the first signal to the signal summing unit through the drain; and
    a first PMOS transistor having a source configured to receive an input signal, a gate connected to the first bias voltage terminal, and a drain connected to a common node connected to the signal summing unit, configured to amplify the input signal through the source, and configured to provide the second signal to the signal summing unit through the drain.

4. The signal amplifier of claim 1, wherein the second common gate-type amplifying unit includes:
    a second NMOS transistor configured to amplify the input signal and configured to provide the third signal to the signal summing unit; and a second PMOS transistor configured to amplify the input signal and configured to provide the fourth signal to the signal summing unit; and wherein the second NMOS transistor and the second PMOS transistor are connected to each other in series between the second common gate-type amplifying unit and the ground, to form a single current path.

5. The signal amplifier of claim 1, wherein the second common gate-type amplifying unit includes:
a second NMOS transistor having a drain connected to a common node connected to the signal summing unit, a gate connected to a second bias voltage terminal, and a source configured to receive the input signal, configured to amplify the input signal through the source, and configured to provide the amplified input signal to the signal summing unit through the drain; and
a second PMOS transistor having a source configured to receive an input signal, and a gate and a drain connected to the ground, configured to amplify the input signal through the source, and configured to provide the amplified input signal to the signal summing unit through the drain.

6. The signal amplifier of claim 1, wherein the second common gate-type amplifying unit includes:
a second NMOS transistor having a drain connected to a common node connected to the signal summing unit, a gate connected to a second bias voltage terminal, and a source configured to receive the input signal, configured to amplify the input signal through the source, and configured to provide the amplified input signal to the signal summing unit through the drain; and
a second PMOS transistor having a source configured to receive an input signal, a drain connected to the ground, and a gate connected to a second gate voltage terminal, configured to amplify the input signal through the source, and configured to provide the amplified input signal to the signal summing unit through the drain.

7. The signal amplifier of claim 1, wherein the impedance matching unit includes:
a first capacitor configured to transfer the first signal from the first common gate-type amplifying unit to the impedance matching unit;
a second capacitor configured to transfer the second signal from the first common gate-type amplifying unit and the third signal from the second common gate-type amplifying unit to the impedance matching unit; and
a third capacitor configured to transfer the fourth signal from the second common gate-type amplifying unit to the impedance matching unit.

8. A signal amplifier comprising:
a first common gate-type amplifying unit connected to a source voltage terminal, configured to divide an input signal into two signals, configured to amplify the two divided signals, respectively, and configured to provide a first signal and a second signal;
a second common gate-type amplifying unit connected between the first common gate-type amplifying unit and a ground, configured to divide the input signal into two signals, configured to amplify the two divided signals, respectively, and configured to provide a third signal and a fourth signal;
a signal summing unit configured to sum the first signal and the second signal from the first common gate-type amplifying unit and the third signal and the fourth signal from the second common gate-type amplifying unit; and an impedance matching unit configured to impedance-match a signal summed by the signal summing unit, wherein the first common gate-type amplifying unit and the second common gate-type amplifying unit are formed in a cascode structure, and the first common gate-type amplifying unit and the second common gate-type amplifying unit are stacked in the cascode structure between the source voltage terminal and a ground terminal, and wherein the first common gate-type amplifying unit and the second common gate-type amplifying unit have levels of transconductance which are set so that matching of input impedance is undertaken.

9. The signal amplifier of claim 8, wherein the first common gate-type amplifying unit includes:
a first NMOS transistor configured to amplify the input signal and configured to provide the first signal to the signal summing unit; and
a first PMOS transistor configured to amplify the input signal and configured to provide the second signal to the signal summing unit; and
wherein the first NMOS transistor and the first PMOS transistor are connected to each other in series between the source voltage terminal and the second common gate-type amplifying unit, to form a single current path.

10. The signal amplifier of claim 8, wherein the first common gate-type amplifying unit includes:
a first NMOS transistor having a gate and a drain connected to the source voltage terminal and a source configured to receive the input signal, configured to amplify the input signal through the source, and configured to provide the first signal to the signal summing unit through the drain; and
a first PMOS transistor having a source configured to receive an input signal, a gate connected to the first bias voltage terminal, and a drain connected to a common node connected to the signal summing unit, configured to amplify the input signal through the source, and configured to provide the second signal to the signal summing unit through the drain.

11. The signal amplifier of claim 8, wherein the first common gate-type amplifying unit includes:
a first NMOS transistor having a drain connected to the source voltage terminal, a gate connected to a first gate voltage terminal, and a source configured to receive the input signal, configured to amplify the input signal through the source, and configured to provide the first signal to the signal summing unit through the drain; and
a first PMOS transistor having a source configured to receive an input signal, a gate connected to the first bias voltage terminal, and a drain connected to a common node connected to the signal summing unit, configured to amplify the input signal through the source, and configured to provide the second signal to the signal summing unit through the drain.

12. The signal amplifier of claim 8, wherein the second common gate-type amplifying unit includes:
a second NMOS transistor configured to amplify the input signal and configured to provide the third signal to the signal summing unit; and
a second PMOS transistor configured to amplify the input signal and configured to provide the fourth signal to the signal summing unit; and
wherein the second NMOS transistor and the second PMOS transistor are connected to each other in series between the second common gate-type amplifying unit and the ground, to form a single current path.

13. The signal amplifier of claim 8, wherein the second common gate-type amplifying unit includes:
a second NMOS transistor having a drain connected to a common node connected to the signal summing unit, a gate connected to a second bias voltage terminal, and a source configured to receive the input signal, configured to amplify the input signal through the source, and configured to provide the amplified input signal to the signal summing unit through the drain; and
a second PMOS transistor having a source configured to receive an input signal, and a gate and a drain connected to the ground, configured to amplify the input signal through the source, and configured to provide the amplified input signal to the signal summing unit through the drain.

14. The signal amplifier of claim 8, wherein the second common gate-type amplifying unit includes:
a second NMOS transistor having a drain connected to a common node connected to the signal summing unit, a gate connected to a second bias voltage terminal, and a source configured to receive the input signal, configured to amplify the input signal through the source, and configured to provide the amplified input signal to the signal summing unit through the drain; and
a second PMOS transistor having a source configured to receive an input signal, a drain connected to the ground, and a gate connected to a second gate voltage terminal, configured to amplify the input signal through the source, and configured to provide the amplified input signal to the signal summing unit through the drain.

15. The signal amplifier of claim 8, wherein the impedance matching unit includes:
a first capacitor configured to transfer the first signal from the first common gate-type amplifying unit to the impedance matching unit;
a second capacitor configured to transfer the second signal from the first common gate-type amplifying unit and the third signal from the second common gate-type amplifying unit to the impedance matching unit; and
a third capacitor configured to transfer the fourth signal from the second common gate-type amplifying unit to the impedance matching unit.

16. A signal amplifier comprising:
a first common gate-type amplifying unit connected to a source voltage terminal, configured to divide an input signal into two signals, configured to amplify the two divided signals, respectively, and configured to provide a first signal and a second signal;
a second common gate-type amplifying unit connected between the first common gate-type amplifying unit and a ground, configured to divide the input signal into two signals, configured to amplify the two divided signals, respectively, and configured to provide a third signal and a fourth signal;
a signal summing unit configured to sum the first signal and the second signal from the first common gate-type amplifying unit and the third signal and the fourth signal from the second common gate-type amplifying unit; and
an impedance matching unit configured to impedance-match a signal summed by the signal summing unit,
wherein the first common gate-type amplifying unit and the second common gate-type amplifying unit form a single current path between the source voltage terminal and a ground terminal;
wherein the first common gate-type amplifying unit includes:
a first NMOS transistor configured to amplify the input signal and configured to provide the first signal to the signal summing unit, and
a first PMOS transistor configured to amplify the input signal and configured to provide the second signal to the signal summing unit;
wherein the second common gate-type amplifying unit includes:
a second NMOS transistor configured to amplify the input signal and configured to provide the third signal to the signal summing unit, and
a second PMOS transistor configured to amplify the input signal and configured to provide the fourth signal to the signal summing unit;
wherein the first NMOS transistor, the first PMOS transistor, the second NMOS transistor, and the second PMOS transistor are formed in a cascode structure, and the first NMOS transistor, the first PMOS transistor, the second NMOS transistor, and the second PMOS transistor are stacked in the cascode structure between the source voltage terminal and the ground terminal, and
wherein the first NMOS transistor, the first PMOS transistor, the second NMOS transistor, and the second PMOS transistor have levels of transconductance which are set so that matching of input impedance is undertaken.

17. The signal amplifier of claim 16, wherein the impedance matching unit includes:
a first capacitor configured to transfer the first signal from the first common gate-type amplifying unit to the impedance matching unit;
a second capacitor configured to transfer the second signal from the first common gate-type amplifying unit and the third signal from the second common gate-type amplifying unit to the impedance matching unit; and
a third capacitor configured to transfer the fourth signal from the second common gate-type amplifying unit to the impedance matching unit.

18. A signal amplifier comprising:
a first common gate-type amplifying unit connected to a source voltage terminal, configured to divide an input signal into two signals, configured to amplify the two divided signals, respectively, and configured to provide a first signal and a second signal;
a second common gate-type amplifying unit connected between the first common gate-type amplifying unit and a ground, configured to divide the input signal into two signals, configured to amplify the two divided signals, respectively, and configured to provide a third signal and a fourth signal;
a signal summing unit configured to sum the first signal and the second signal from the first common gate-type amplifying unit and the third signal and the fourth signal from the second common gate-type amplifying unit; and
an impedance matching unit configured to impedance-match a signal summed by the signal summing unit,
wherein the first common gate-type amplifying unit and the second common gate-type amplifying unit are formed in a cascode structure, and the first common gate-type amplifying unit and the second common gate-type amplifying unit are stacked in the cascode structure between the source voltage terminal and a ground terminal,
wherein the first common gate-type amplifying unit includes:

a first NMOS transistor configured to amplify the input signal and configured to provide the first signal to the signal summing unit; and a first PMOS transistor configured to amplify the input signal and configured to provide the second signal to the signal summing unit, wherein the second common gate-type amplifying unit includes:

a second NMOS transistor configured to amplify the input signal and configured to provide the third signal to the signal summing unit; and a second PMOS transistor configured to amplify the input signal and configured to provide the fourth signal to the signal summing unit, and wherein the first NMOS transistor, the first PMOS transistor, the second NMOS transistor, and the second PMOS transistor are connected to each other in series between the source voltage terminal and the ground, to form a single current path.

19. The signal amplifier of claim 18, wherein the impedance matching unit includes:

a first capacitor configured to transfer the first signal from the first common gate-type amplifying unit to the impedance matching unit;

a second capacitor configured to transfer the second signal from the first common gate-type amplifying unit and the third signal from the second common gate-type amplifying unit to the impedance matching unit; and a third capacitor configured to transfer the fourth signal from the second common gate-type amplifying unit to the impedance matching unit.

\* \* \* \* \*